United States Patent [19]

Kurtz et al.

[11] Patent Number: 4,994,344

[45] Date of Patent: Feb. 19, 1991

[54] SHEETLIKE LIGHT-SENSITIVE RECORDING

[75] Inventors: Karl-Rudolf Kurtz, Heidelberg; Horst Koch, Gruenstadt; Thomas Telser, Schriesheim; Manfred Zuerger, Sinsheim, all of Fed. Rep. of Germany

[73] Assignee: BASF Aktiengesellschaft, Ludwigshafen, Fed. Rep. of Germany

[21] Appl. No.: 306,547

[22] Filed: Feb. 3, 1989

[30] Foreign Application Priority Data

Feb. 5, 1988 [DE] Fed. Rep. of Germany ....... 3803457

[51] Int. Cl.$^5$ ................................................ G03C 1/76
[52] U.S. Cl. ..................................... 430/273; 430/286; 430/771; 430/781; 430/288; 430/306; 522/107
[58] Field of Search ............... 430/286, 288, 287, 907, 430/271, 281, 306, 273; 522/106, 107, 104

[56] References Cited

U.S. PATENT DOCUMENTS

| | | |
|---|---|---|
| 3,453,311 | 7/1969 | Miller . |
| 3,884,693 | 5/1975 | Bauer et al. . |
| 3,926,642 | 12/1975 | Breslow et al. ................. 430/286 |
| 4,072,527 | 2/1978 | Fan . |
| 4,162,919 | 7/1979 | Richter et al. . |
| 4,205,139 | 5/1980 | Barzynski et al. . |
| 4,271,259 | 6/1981 | Breslow et al. ................. 430/286 |
| 4,272,610 | 6/1981 | Breslow et al. ................. 430/281 |
| 4,277,593 | 7/1981 | Scheve ............................ 430/194 |
| 4,424,314 | 1/1984 | Barzynski et al. . |
| 4,877,715 | 10/1989 | Koch et al. ..................... 430/306 |

FOREIGN PATENT DOCUMENTS

| | | |
|---|---|---|
| 0084851 | 8/1983 | European Pat. Off. . |
| 2823300 | 12/1979 | Fed. Rep. of Germany . |
| 2233187 | 3/1976 | France . |
| 1366769 | 9/1974 | United Kingdom . |

OTHER PUBLICATIONS

Hawley's Condensed Chemical Dictionary; Eleventh Edition; Van Nostrand Reinhold, Co.; N.Y., N.Y.; p. 491; "Ethylene-Propylene-Terpolymer", 1987.
Chemical Abstract 112,950j, v.82, No. 18, p. 112958 (May 5, 1975).

*Primary Examiner*—Marion C. McCamish
*Assistant Examiner*—Christopher D. RoDee
*Attorney, Agent, or Firm*—Keil & Weinkauf

[57] ABSTRACT

A light-sensitive recording element useful for preparing photopolymer flexographic relief printing plates, comprising at least one photopolymerizable recording layer having a thickness of from 0.1 to 7 mm and made up of:
from 20 to 99.499% by weight of at least one polymeric binder which may be random ethylene-propylene-alkadiene terpolymers having an ethylene content of from 40 to 80% by weight and a double bond content of from 2 to 20 olefinic double bonds per 1,000 carbon atoms;
from 0.001 to 10% by weight of at least one photopolymerization initiator,
from 0.5 to 50% by weight of at least one monomer which is compatible with the binder and has at least one photopolymerizable olefinic double bond, and
from 0.001 to 2% by weight of at least one inhibitor of thermally initiated polymerization and from 0.0001 to 5% by weight of at least one antioxidant as assistants.

29 Claims, No Drawings

SHEETLIKE LIGHT-SENSITIVE RECORDING

The present invention relates to a sheetlike light-sensitive recording material comprising at least one photopolymerizable relief forming layer (A) consisting essentially of

- ($a_1$) from 20 to 99.499% by weight of at least one polymeric binder from the group consisting of random ethylene-propylene-alkadiene terpolymers having an ethylene content of from 40 to 80% by weight and a double bond content of from 2 to 20 olefinic double bonds per 1,000 carbon atoms,
- ($a_2$) from 0.001 to 10% by weight of at least one initiator for photopolymerization,
- ($a_3$) from 0.5 to 50% by weight of at least one monomer which is compatible with the binder ($a_1$) and has at least one photopolymerizable olefinic double bond, and
- ($a_4$) from 0 to 40% by weight of at least one assistant with whose assistance the range of properties is varied.

In the above definition, the term sheetlike applies to all those spatial forms whose thickness is appreciably less than their length and width. Accordingly, the recording material in question here is bandlike or platelike.

A recording material is designated light-sensitive if it contains a layer in which imagewise exposure to actinic light brings about a solubility differentiation between the exposed and unexposed areas, so that the layer can be washed out, i.e. developed, with developers. Consequently, on uniform exposure to actinic light, this relief-forming layer (A) becomes completely insoluble or completely soluble/very readily swellable in the developer.

A relief-forming layer (A) is considered photopolymerizable if, owing to its material composition, imagewise exposure to actinic light initiates a photopolymerization which then takes its course. The result is a solubility differentiation between the exposed and unexposed areas of the layer (A), which is why its unexposed areas can be washed out (developed) with developers.

Developers are liquids which contain in the main a solvent or solvent mixture. In addition, these developers may in general contain additives, such as solid, liquid or gaseous, organic and inorganic compounds. They are used for the process of development, i.e. the washing out of the relief-forming layer (A) after imagewise exposure. The prerequisite for a specific relief-forming layer (A) to be developable with a specific solvent after imagewise exposure is in particular the solubility or swellability of the binder ($a_1$) in the developer in question. The nature of the developer therefore also permits unambiguous inferences about the material composition of the relief-forming layer (A).

The term compatible indicates that the component in question is molecularly dispersible in the relief-forming layer (A), does not cause cloudiness therein, and does not separate out therefrom with time.

Variation of the range of properties is to be understood as meaning the controlled improvement of certain application properties of photopolymerizable relief-forming layers (A) and photopolymerized relief layers (A') produced therefrom. These improvements are noticeable in particular in relief plates, relief printing plates and photoresists that contain photopolymerized relief layers (A') and are obtained in general by the addition of customary and known additives to the relief-forming layers (A). It is these additives which are therefore referred to as assistants.

Sheetlike light-sensitive recording materials are known from DE-B-22 15 090, DE-A-29 42 183, DE-A-24 44 118, DE-A-24 56 439 and DE-A-21 83 582. These known recording materials contain no ethylene-propylene-alkadiene terpolymers but other polymers as binders ($a_1$).

The known recording materials are used for the production of relief printing plates, in particular flexographic printing plates, by imagewise exposure and development of their photopolymerizable relief-forming layer (A).

Ready-produced flexographic printing plates are used in particular for printing films, foils, corrugated cardboard and packaging. The disadvantage is that the use of prior art flexographic printing plates is subject to substantial restriction in the choice of printing inks.

Customary printing inks contain as the main component a solvent, as well as colorants and binders. This solvent is mainly ethanol and water. To increase the ink opacity and the rate of drying on nonabsorbent printing stocks such as polyethylene terephthalate, polyvinyl chloride or polyvinylidene chloride films, aluminum foil or cellophane, the printing inks are admixed with accelerants which have high evaporation rates and/or an adhesion-promoting action. Preferred accelerants are ethyl acetate, n-propyl acetate, i-propyl acetate, acetone, methyl ethyl ketone, butanone and methyl isobutyl ketone.

Existing flexographic printing plates, however, are not sufficiently resistant to these accelerants. For instance, on being printed with printing inks having a ketone and/or ester content of more than 10% by weight, they undergo an increase in thickness and volume, which prevents a long print run. To print with these printing inks it is therefore generally necessary to use a rubber plate. This rubber plate must be prepared by the conventional molding methods of cutting and/or hot pressing and frequently also by sanding down on the back. At any rate, it is impossible here to employ the elegant, accurate and time-saving irradiation and development techniques, which in itself is enough to constitute an extremely serious disadvantages. Another factor is that rubber plates give only an inexact reproduction of the image motifs, that their reliefs have wide sidewalls, and that, in printing, they give rise to loss of tonal value and breaking off of parts of the halftone areas and isolated fine image sections.

These rubber plates are frequently produced using ethylene-propylene-alkadiene monomer terpolymers, generally also referred to as EPDM rubbers. In the molding of the rubber plate, these EPDM rubbers are chemically crosslinked, i.e. vulcanized, by sulfur or peroxides in the conventional manner. Owing to their optical properties, they are completely unsuitable for the elegant, accurate and time-saving irradiation and development techniques employed on existing sheetlike light-sensitive recording materials comprising photopolymerizable relief-forming layers (A).

It is an object of the present invention to provide a novel sheetlike light-sensitive recording material comprising a photopolymerizable relief-forming layer (A) which is free of the disadvantages of the prior art.

We have found that this object is achieved with the sheetlike light-sensitive recording material I defined at the beginning, which hereinafter will be referred to as recording material I according to the invention for short.

The essential constituent of recording material I according to the invention is its novel photopolymerizable relief-forming layer (A).

The novel photopolymerizable relief-forming layer (A) contains, based on (A), from 20 to 99.499% by weight of at least one polymeric binder ($a_1$) from the group consisting of the random ethylene-propylene-alkadiene terpolymers having an ethylene content of from 40 to 80% by weight and a double bond content of from 2 to 20 double bonds per 1,000 carbon atoms.

The reason the level of ethylene-propylene-alkadiene terpolymer ($a_1$) in the novel layer (A) should not exceed 99.499% by weight is that otherwise the photo-polymerization in the novel layer (A) will be very slow and the resulting solubility differentiation on image-wise exposure will not meet practical requirements. On the other hand, the level of ethylene-propylene-alkadiene terpolymer ($a_1$) in the novel layer (A) should not be less than 20% by weight because otherwise the mechanical strength of the novel layer (A) will not be up to standard.

According to the invention, it is advantageous for the ethylene-propylene-alkadiene terpolymer ($a_1$) content to be from 25 to 95, preferably from 30 to 90, in particular from 35 to 85, % by weight. Of these ranges, the range from 35 to 85% by weight is particularly advantageous because the novel photopolymerizable relief-forming layer (A) has particularly advantageous properties if the ethylene-propylene-alkadiene terpolymer ($a_1$) content is within this range. A further improvement results if the content is within the range from 70 to 83% by weight. This level of ethylene-propylene-alkadiene terpolymer in the novel layer (A) is most suitable in particular if the novel recording material I in question is used for the production of flexographic printing plates.

The ethylene-propylene-alkadiene terpolymers ($a_1$) to be used according to the invention have an ethylene content of from 40 to 80% by weight. The reason the ethylene content should not exceed 80% by weight is that otherwise the terpolymer ($a_1$) in question, because of its physical-chemical properties, is less suitable for the construction of the novel layer (A). On the other hand, the ethylene content should not be less than 40% by weight since otherwise the terpolymer ($a_1$) in question likewise has less good application properties. An ethylene content of from 45 to 75% by weight is of advantage because the ethylene-propylene-alkadiene terpolymers ($a_1$) having this ethylene content are particularly favorable polymeric binders ($a_1$) for the novel photopolymerizable relief-forming layer (A) of the recording material I according to the invention.

The ethylene-propylene-alkadiene terpolymers ($a_1$) used according to the invention have a double bond content of from 2 to 20 olefinic double bonds per 1,000 carbon atoms. The presence of double bonds is due to the inclusion of alkadienes as copolymerized units in the preparation of terpolymers ($a_1$). The olefinic double bonds present in the terpolymer ($a_1$) are present in the main chain thereof and/or in side groups thereon. Regardless of whether the olefinic double bonds are present in the main chain or in side groups thereon or whether they are present in varying proportions not only in the main chain but also in the side groups thereon, the double bond content of terpolymers ($a_1$) should not be less than 2 olefinic double bonds per 1,000 carbon atoms and not be more than 20 olefinic double bonds. This is because if the double bond content is less than that in question, the result is a photopolymerizable relief-forming layer (A) which on imagewise exposure and development gives only moderate to poor relief layers (A'). If, on the other hand, the double bond content in question is exceeded, the result is a photopolymerizable relief-forming layer (A) which on imagewise exposure and development gives a relief layer (A') which is not suitable for flexographic printing. Accordingly, the range from 2 to 20 olefinic double bonds per 1,000 carbon atoms is the optimum range within which the double bond content is variable in a controlled manner in accordance with the requirements. Within this range, the range from 4 to 15 olefinic double bonds per 1,000 carbon atoms has to be singled out since it produces a very particularly advantageous technical effect.

The ethylene-propylene-alkadiene terpolymers ($a_1$) to be used according to the invention contain at least one alkadiene in copolymerized form. This alkadiene may be any alkadiene which can be made to react with ethylene and propylene to give a terpolymer in a conventional ethylene copolymerization. It is advantageous to use a 1,4-alkadiene such as 1,4-butadiene, isoprene, 1,4-pentadiene, 1,4-hexadiene, 1,4-heptadiene, dicyclopentadiene or ethylidenenorbornene and very particularly advantageous to use dicyclopentadiene, trans-1,4-hexadiene and ethylidenenorbornene.

Examples of ethylene-propylene-alkadiene terpolymers ($a_1$) which are very particularly preferred according to the invention are
ethylene-propylene-dicyclopentadiene,
ethylene-propylene-ethylidenenorbornene,
ethylene-propylene-trans-1,4-hexadiene,
ethylene-propylene-dicyclopentadiene-ethylidenenorbornene,
ethylene-propylene-dicyclopentadiene-trans-1,4-hexadiene,
ethylene-propylene-ethylidenenorbornene-trans-1,4-hexadiene and
ethylene-propylene-ethylidenenorbornene-dicyclopentadiene-trans-1,4-hexadiene terpolymers ($a_1$), which contains from 45 to 75% by weight of ethylene and sufficient alkadiene as copolymerized units to have a double bond content of from 4 to 15 olefinic double bonds per 1,000 carbon atoms.

The ethylene-propylene-alkadiene terpolymers ($a_1$) to be used according to the invention that were described above in detail are known per se and are prepared in a conventional ethylene copolymerization.

The novel photopolymerizable relief-forming layer (A) contains, based on (A), from 0.001 to 10, preferably from 0.1 to 7, advantageously from 0.2 to 5, in particular from 0.3 to 4, % by weight of one or more initiators of photopolymerization (photoinitiators) ($a_2$), the amount thereof also depending on the amount of component ($a_3$) used.

Examples of suitable photoinitiators ($a_2$) are benzoin and benzoin derivatives, such as benzoin methyl, isopropyl, n-butyl or isobutyl ether, symmetrically or asymmetrically substituted benzil acetals, such as benzil dimethyl acetal or benzil 1-methyl 1-ethyl acetal, acylarylphosphine oxides, such as 2-dimethoxybenzoyldiphenylphosphine oxide, 2,4,6-trimethylbenzoyldiphenylphosphine oxide, ethyl 2,4,6-trimethylbenzoylphenyl phosphinate or sodium 2,4,6-trimethylbenzoylphenylphosphinate, and substituted or unsubstituted quinones, such as ethylanthraquinone, benzanthraquinone, benzophenone or 4,4'-bis(dimethylamino)benzophenone. They can be used alone or mixed with one another or combined with coinitiators, for example ethylanthraquinone combined with 4,4'-bis(dimethylamino)benzophenone, benzoin methyl ether combined with triphenylphosphine, diacylphosphine oxides combined with tertiary amines or acylarylphosphine oxides combined with benzyl dimethyl acetal.

The novel photopolymerizable relief-forming layer (A) contains, based on (A), from 0.5 to 50, advantageously 0.5 to 30, preferably from 1 to 20 and in particular from 1 to 15, % by weight of at least one monomer which is compatible with the binder ($a_1$) and has at least one photopolymerizable olefinically unsaturated double bond.

Suitable monomers ($a_3$) generally have a boiling point under atmospheric pressure of above 100° C. and a molecular weight of not more than 3,000, in particular not more than 2,000. In general, suitable monomers ($a_3$) are esters of acrylic acid or methacrylic acid, styrene and derivatives thereof, esters of fumaric acid or maleic acid, acrylamides, methacrylamides, and allyl compounds. For them to be usable they must meet the claim stipulation of compatibility with the binder ($a_1$).

Examples of particularly highly suitable monomers ($a_3$) which give particularly advantageous results are isobronyl acrylate, isobornyl methacrylate, dihydrodicyclopentadienyl acrylate, dihydrodicyclopentadienyl methacrylate, hex-1-en-6-yl acrylate, hex-1-en-6-yl methacrylate, acrylate, dihydroxylimonene diacrylate, dihydroxylimonene dimethacrylate, dicyclopentyldimethylene, diacrylate, dicyclopentyldimethylene dimethacrylate, thiodiethylene glycol diacrylate, thiodiethylene glycol dimethacrylate, benzyl acrylate, benzyl methacrylate, dodecanediol diacrylate, dodecanediol dimethacrylate, di-n-butyl fumarate, di-n-octyl fumarate, divinylbenzene, diallyl phthalate and bisallyl itaconate.

The novel photopolymerizable relief-forming layer (A) may contain one or more assistants with whose assistance the range of application properties of the novel layer (A) of the recording materials I according to the invention and of the relief printing plates and photo-resists produced therefrom may be varied.

These assistances are in particular plasticizers, inhibitors of thermally initiated polymerization, dyes, pigments, photochromic additives, agents for improving the relief structure, crosslinking aids, antioxidants, antiozonants, fillers, fluxes or mold release agents. Their amount should in general not exceed 40% by weight of the novel layer (A).

Examples of plasticizers are modified and unmodified natural oils and resins, such as paraffinic or naphthenic oils and also petroleum resins or pentaerythritol esters of hydrogenated rosin, alkyl, alkenyl, arylalkyl or arylalkenyl alcohol esters of acids, such as citric acid, acetic acid, propionic acid, butyric acid, ethylbutyric acid, ethylhexanoic acid, glycolic acid, benzoic acid, phthalic acid, trimellitic acid, abietic acid, phosphoric acid or stearic acid, synthetic oligomers or resins, such as oligostyrene, oligomeric styrene-butadiene copolymers, oligo-α-methylstyrene, oligomeric α-methylstyrene/p-methylstyrene copolymers, liquid 1,2- or 1,4-oligobutadienes, oligopentadienes or liquid oligomeric acrylonitrile-butadiene copolymers, and also polyterpene, polyacrylate, polyester or polyurethane resins, synthetic polymers, such as polyethylene or ethylene-propylene-diene rubbers, ω-methyl oligo(ethylene oxide), and sulfonamides.

Examples of particularly highly suitable plasticizers are the paraffinic mineral oils, the esters of dicarboxylic acids, such as dioctyl adipate or dioctyl terephthalate, the naphthenic plasticizers, preferably having an aromatics content <20% and/or a sulfur content >5%, polyoctenamers, i.e. macrocycles of poly(octenylene), within the molecular weight range $1,000-1.2 \times 10^5$, and polybutadienes having a molecular weight of from 500 to 5,000, in particular those having a vinyl group content >50%. Not only the polyoctenamers but also the polybutadienes may contain functional or reactive end groups, for example COOH—, OH—, $NH_2$—, carboxylic anhydride or acrylate groups. Of advantage are amounts of from 1 to 25% by weight, based on the layer (A).

Inhibitors of thermally initiated polymerization are in general added in an amount of from 0.001 to 2% by weight, based on the novel layer (A). They do not in general show any significant self-absorption in the actinic region where the photoinitiator ($a_2$) is absorbing. Examples of inhibitors are hydroquinone, p-methoxyphenol, 2,6-di-tert.-butyl-p-cresol, β-naphthol, phenothiazine, pyridine, nitrobenzene, m-dinitrobenzene, chloranil, thiazine dyes, such as thionine blue G (C.I. 52025), methylene blue B (C.I. 52015) or toluidine blue (C.I. 52040), and N-nitrosamines, such as N-nitrosodiphenylamine or the salts, for example the potassium, calcium or aluminum salts, of N-nitrosocyclohexylhydroxylamine.

Dyes, pigments or photochromic additives may be added to the novel layers (A) in an amount of from 0.0001 to 2% by weight, based on (A). They aid control of the exposure properties, identification, or the direct inspection of the exposure result, or serve esthetic purposes. It is a prerequisite for the choice and the amount of such additives that they, like the inhibitors of thermally initiated polymerization, do not interfere with the photopolymerization of the mixtures. It is possible to use for example the soluble phenazinium, phenoxazinium, acridiniuim and phenothiazinium dyes. These dyes are also used together with a sufficient amount of a reducing agent which in the absence of actinic light does not reduce the dye but on exposure to light is able to reduce the dye in the excited state. Examples of such mild reducing agents are ascorbic acid, anethole, thiourea, e.g. diethylallylthiourea, in particular N-allylthiourea, and also hydroxyalmine derivatives, in particular salts of N-nitrosocyclohexylhydroxylamine, preferably the potassium, calcium and aluminum salts. The latter, as mentioned, can also serve as inhibitors of thermally initiated polymerization.

The reducing agents are added in general in amounts of form 0.005 to 5% by weight, based on the novel layer (A), the addition of from 3 to 10 times the amount of dye used having proven useful in many cases.

Examples of crosslinking aids are the customary and known tri- and tetrafunctional thiol compounds.

Examples of antioxidants are sterically hindered monophenols, such as 2,6-di-tert.-butyl-p-cresol, alkylated thio- and alkylidene-bisphenols, such as 2,2'-methyl-enebis(4-methyl-6-tert.-butylphenol) or 2,2'-bis(1-hydroxy-4-methyl-6-tert.-butylphenyl) sulfide, hydroxybenzyls, such as 1,3,5-trimethyl-2,4,6-tris(3,5-di-tert.-butyl-4-hydroxybenzyl)benzene, triazines, such as 2-(4-hydroxy-3,5-tert.-butylanilino)-4,6-bis(n-octylthio)-1,3,5-triazine, polymerized trimethyldihydroquinone, zinc butyl dithiocarbamate, dilauryl thiodipropionate, and phosphites, such as tri(nonylphenyl) phosphite. Of advantage are amounts of from 0.001 to 5% by weight, based on the novel layer (A).

Examples of polymeric and nonpolymeric organic and inorganic fillers or reinforcing fillers which cannot be mixed in in a molecularly disperse form are those which substantially transmit the wavelengths of the light used for irradiating the recording material I according to the invention, do not scatter this light, and in their refractive index are substantially adapted to the novel recording material I or layer (A) in question, such as polystyrene, organophilic silicon dioxide, bentonite, silica, ®Aerosil, organophilic aluminum oxide, glass powder, colloidal carbon and various kinds of dyes and pigments. These assistants are used in amounts which vary with the properties desired of the recording materials I according to the invention. The fillers have the advantage that they further improve the strength of the novel photopolymerizable relief-forming layers (A) and the relief layer (A') produced therefrom and the abrasion resistance thereof, reduce any tackiness, and in certain circumstances are effective therein as coloring agents.

An example of a flux is calcium stearate.

An example of a mold release agent is talc.

Examples of antiozonants are the customary and known antiozone waxes and chloroalkanes (chloroparaffins) of from 8 to 40 carbon atoms and having from 30 to 73% by weight of chlorine in the molecule.

Examples of agents for improving the relief structure of the relief printing plates produced from the recording materials I according to the invention are 9,9'-dianthronyl and 10,10'-bisanthrone.

The thickness of the novel photopolymerizable relief-forming layer (A) depends first and foremost on the intended use for the recording materials I according to the invention; it varies in general from 0.001 to 7, preferably from 0.1 to 7, in particular from 0.7 to 6.5, mm since the recording materials I according to the invention which incorporates novel layers (A) of this thickness are suitable for the majority of printing techniques and also for the photoresist technique.

Besides the novel photopolymerizable relief-forming layer (A) the recording material I according to the invention may contain further layers or sheetlike structures which are useful to its function.

For instance, the novel photopolymerizable relief-forming layer (A) may be bonded firmly or easily detachably to a dimensionally stable base (B). The dimensionally stable base (B) in turn may be underlaid with a flexible and resilient bottom layer (BL). Furthermore, a firm bond between the base (B) and the novel layer (A) may be obtained by means of an adhesion-promoting layer (APL). If the base (B) is easily detachable from the novel layer (A), it is also referred to as a temporary base (B).

Suitable dimensionally stable bases (B) are boards, sheets or conical or cylindrical sleeves made of metals, such as steel, aluminum, copper or nickel, or of plastics, such as polyethylene terephthalate, polybutylene terephthalate, polyamide or polycarbonate. Other possibilities are fabrics and mats, for example glass fiber fabrics or composite materials made for example of glass fibers and plastics such as polyethylene terephthalate. The base (B) may also be a board of the type customarily used in the production of circuit boards.

The adhesion-promoting layer (APL) used is advantageously a customary and known layer of adhesive-forming components approximately 0.5–40 μm in thickness.

If the base (B) used is a strongly reflecting plate, film or foil, it may contain a suitable antihalation agent, such as carbon black or manganese dioxide. However, the antihalation agent may also be applied to the base (B) as a separate layer or be present in the adhesion-promoting layer (APL) or in the novel layer (A).

In addition, the recording material I according to the invention may contain a light transmitting, smooth or matted, nontacky top layer (C) which is soluble or swellable in the developers for the novel layer (A), adheres to the novel layer (A) more firmly than to any cover sheet (D) present, and is formed by a polymer which forms tear resistant films and any additives present therein.

Examples of suitable polymers which form tear resistant films are polyamides, copolyamides, polyurethanes, poly(meth)acrylates, polyvinyl alcohol alkanecarboxylates of a degree of hydrolysis of from 30 to 99%, cyclorubbers of high cyclization, ethylene/propylene copolymers, homopolymers and copolymers of vinyl chloride, and ethylene/vinyl acetate copolymers.

Examples of suitable cover layers (C) which contain additives are known from U.S. Pat. No. 4,162,919, DE-A-2,823,300, DE-B-2,123,702, U.S. Pat. Nos. 4,072,527 or 3,453,311.

Examples of particularly highly suitable cover layers (C) which contain additives are described in German Patent Application P 37 32 527.2.

In general, the cover layers are from 0.2 to 25 μm in thickness.

Furthermore, the recording material I according to the invention may contain a cover sheet (D) which is easy to detach from the novel photopolymerizable relief-forming layer (A) or from the top layer (C).

The cover sheets (D) are from 10 to 250, in particular from 20 to 150, μm in thickness. They consist essentially of plastics, textile materials, papers or metals. The surface of the cover sheet (D) immediately adjacent to the top layer (C) is smooth, having a surface roughness $R_{max} < 0.1$ μm, or it is matted, having a surface roughness $R_{max}$ of from 0.1 to 15, preferably from 0.3 to 10, in particular from 0.5 to 7, μm. If the cover sheet (D) is matted, its roughness pattern becomes embossed in the top layer (C) and possibly also in the surface of the novel layer (A). This smooth or matt surface of the cover sheet (D) may also have been made antiadhesive; that is, it may for example bear an antiadhesive layer (AHL) from 0.1 to 0.5 μm thick of customary known silicones or of other plastics, for example polyethylene or polypropylene. Cover sheets (D) made of textile materials or papers may in addition be impregnated with plastics such as ureaformaldehyde or polyolefins. Cover sheets (D) made of plastics may in addition be biaxially oriented. Here it is frequently of advantage to apply prior to biaxial orientation a layer from 0.1 to 0.5 μm thick of, for example, vinylidene chloride copolymer to that side of (D) which will later be immediately adjacent to (C) or the novel layer (A).

Examples of particularly advantageous cover sheets (D) are smooth or matted, biaxially oriented or undrawn plastics films (with or without an antiadhesive finish) from 20 to 150 μm thick, made of polyethylene, polypropylene, polyamide, polystyrene, styrene/acrylonitrile copolymers or polymethyl methacrylate, or of copolymers of methyl methacrylate with methacrylic acid, acrylic acid, methyl acrylate or butyl acrylate, or of polyvinyl chloride, polyvinyl acetate, vinyl chloride/vinyl acetate copolymers, polyvinyl alcohol, polyvinylpyrrolidone, polycarbonate, cellulose esters, for example cellulose acetate succinate, or polyethylene terephthalate, of which cover sheets (D) made of polyethylene terephthalates are very particularly advantageous.

The method of preparing the recording material I according to the invention has no special technical features, but is in accordance with the conventional manner of preparing light-sensitive layers in general and top layers in particular and in accordance with the conventional manner of producing sheets from plastics, textile materials, papers or metals.

For instance, the novel photopolymerizable relief-forming layers (A) are customarily produced by mixing the above-described components $(a_1)$, $(a_2)$, $(a_3)$ and any $(a_4)$ by means of the customary kneadings, mixing and dissolving techniques and by forming the resulting mixtures (A) into sheetlike novel layers (A) by casting from solution, hot pressing, calendering or extruding. If the recording materials I according to the invention consist merely of the novel layer (A), the preparation thereof completes the manufacturing process as a whole.

If the recording materials I according to the invention contain further layers of sheetlike structures, further operations must be carried out either as part of the process for manufacturing the multilayered recording materials I according to the invention or separately therefrom.

For instance, the top layer (C) is customarily prepared by techniques that are also suitable for preparing the novel layer (A).

The constituents of the cover sheets (D) are likewise mixed together by customary kneading, mixing and dissolving techniques and formed into the corresponding sheets by casting from solution, hot pressing, calendering or extruding and blow molding. These operations too may form part of the process of manufacturing recording materials according to the invention, but normally the cover sheets (D) are produced separately, wound up in reel form and employed in this form for producing the multilayered recording materials I according to the invention.

Nor does the method of preparing the multilayered recording materials I according to the invention have any special technical features, being instead in accordance with the conventional manner of joining the novel photopolymerizable relief-forming layer (A) to the top layer (C) and the cover sheet (D), which may also take place on a dimensionally stable base (B) with or without the use of an adhesion-promoting layer (APL) and a flexible and resilient bottom layer (BL). Here it is basically possible first to join the novel layer (A) to the base (B) and then to cover its uncovered side with the top layer (C) and a cover sheet (D), or, alternatively, first to apply the novel layer (A) to the cover sheet (D), which has been coated with the top layer (C), and only then to join the assembly to the base (B). It is of course possible to carry out these operations in succession or simultaneously in conventional continuous or batchwise apparatus.

In any case, the novel photopolymerizable relief-forming layer (A) may be composed of novel photopolymerizing sublayers (A). These novel sublayers (A) may be of identical, substantially identical or different material composition. The novel layer (A) composed of sublayers (A) may be produced by the method described in EP-A 0,084,851.

The novel monolayered or multilayered recording materials I according to the invention have particular advantages: conventional manufacture without any need for retrofitting existing plant and apparatus or even fresh investment in new purpose-built plant or apparatus, dimensional stability, no cold flow tendency, and no exudation of components present therein. Hence they are safely transportable and storable for prolonged periods without incurring any damage.

The particular advantages of the monolayered or multilayered recording materials I according to the invention become convincingly manifest when these materials are used for the production of relief printing plates and photoresists and especially flexographic printing plates. This production of relief printing plates and photoresists from the monolayered or multi-layered recording materials I according to the invention customarily comprises the following operations:

(i) pretreating, if necessary, of the recording materials I according to the invention,
(ii) detaching the cover sheet (D), if present, from the top layer (C), if present,
(iii) placing an image mask or negative original onto the novel layer (A) or onto the top layer (C), if present,
(iv) subjecting the novel photopolymerizable relief-forming layer (A) to imagewise exposure under actinic light of a wavelength λ from 230 to 450, in particular from 350 to 450, nm,
(v) washing out (developing) the unexposed areas of the relief-forming layer (A) subjected to imagewise exposure by means of suitable organic developers, which also washes away any top layer (C) present,
(vi) drying and
(vii) aftertreating, if necessary, the resulting relief printing plates or photoresists which now contain or consist of the novel relief layer (A').

The thickness of the novel relief layer (A') varies with the intended use of the relief printing plates and photoresists from 0.001 to 7, preferably from 0.1 to 7 and in particular from 0.7 to 6.5, mm.

A customary method of pretreatment comprises the uniform exposure of the novel layer (A) to actinic light from the back, the back being the side remote from the novel relief layer (A') formed later.

Suitable light sources for actinic light are commercial UV fluorescent tubes, mercury medium, high and low pressure lamps, superactinic fluorescent tubes, pulsed xenon lamps, lamps doped with metal iodides, or carbon arc lamps.

Examples of suitable organic developers are aliphatic or aromatic hydrocarbons, such as n-hexane, n-heptane, octane, petroleum ethers, ligroin, limonene or other terpenes, toluene, xylene, ethylbenzene or isopropylbenzene or mixtures of these solvents, ketones, such as acetone or methyl ethyl ketone, ethers, such as di-n-butyl ether, esters, such as ethyl acetate or ethyl acetoacetate, halogenated aliphatic hydrocarbons, such as methylene chloride, chloroform, trichloroethane, tetrachloroethylene, dichlorotetrafluoroethanes or trichlorotrifluoroethanes, mixtures which contain two or more of these solvents, mixtures which contain one or more of these solvents and in addition alcohols, such as methanol, ethanol, isopropanol or n-butanol, and solvents and mixtures of the aforementioned kind which additionally contain solid, liquid or gaseous organic and inorganic compounds, for example surfactants, in minor amounts.

Customary methods of aftertreating the novel relief layer (A') are uniform afterexposure to actinic light of a wavelength λ of from 150 to 450 nm, afterexposure to visible light, or treatment with halogen-containing solutions.

If the monolayered or multilayered recording materials I according to the invention are subjected to this process, they prove to be exposable with short irradiation times and with very generous irradiation tolerances, faithful in reproducing even very fine and therefore critical motifs of image masks or negative originals and very stable to washing out, so that development conditions may safely be intensified in order to shorten development times.

This shortens the cycle times in the production of relief printing plates and photoresists, which is an appreciable advantage for industrial operation. This advantage is especially pronounced in the production of flexographic printing plates.

This does not exhaust the particular advantages of the recording materials I according to the invention, but they become specially manifest in those relief printing plates and photoresists produced in the above-described manner.

For instance, the novel photoresists are usable with advantage for the production of circuit boards, and the novel relief printing plates, in particular the novel flexographic printing plates, are mountable on printing cylinders and highly useful in that state for continuous printing.

This purpose does not require the novel flexographic printing plates, unlike those of the prior art, to be aftertreated with halogen-containing solutions since they already have a uniformly matt and nontacky surface.

On printing on a customary and known flexographic printing press they show marked stability to printing inks which contain esters and/or ketones. In addition, the novel flexographic printing plates are distinctly more stable to ozone than prior art flexographic printing plates, so that using the novel flexographic printing plates it is possible to obtain long runs of printed copies of excellent quality. Moreover, the novel flexographic printing plates are repeatedly reusable without the quality of the printed copies being affected. To this end, the novel flexographic printing plates may either be stored mounted on printing cylinders, or repeatedly taken off the printing cylinders, stored and thereafter again mounted on printing cylinders without drawbacks, in which case the method for joining the cut edges of flexographic printing plates described in German Patent Application P 37 12 070.0 may be used with particular advantage.

EXAMPLES

EXAMPLES 1 TO 8

The preparation of recording materials I according to the invention and the further processing thereof into novel flexographic printing plates. General experimental method:

To produce the novel photopolymerizable relief-forming layer (A), the binder ($a_1$) was uniformly introduced into a twin-screw devolatilization extruder and melted at from 140° to 160° C. The liquid or dissolved components ($a_2$), ($a_3$) and ($a_4$) of the novel layer (A) were pumped in succession into the extruder and mixed therein with the melt of the binder ($a_1$). The resulting light-sensitive mixture (A) was discharged from a flat sheet die and passed from there directly into the nip of a calender, where it was formed into a 2,900 μm thick novel layer (A) and at the same time bonded on one of its sides to a 5 μm thick top layer (C) of polyamide and a matted 125 μm thick polyethylene terephthalate sheet (cover sheet D) and on its other side to a 125 μm thick polyethylene terephthalate sheet as a temporary base (B).

The result was a multilayered recording material I of structure (B)/(A)/(C)/(D) according to the invention. Samples were taken to carry out the tests outlined below.

The prominent portion of the multilayered recording material according to the invention was subjected to a 1 minute uniform exposure from the back through the base (B) under actinic light in a tubular exposure unit. Thereafter, the base (B) was peeled off the layer (A) and the polyethylene terephthalate sheet (D) off the top layer (C).

Following this pretreatment, the multilayered recording material I according to the invention was subjected to imagewise exposure under actinic light in a ®Cyrel 3040-115W flat exposure unit through a customary and known test negative original placed on top of the top layer (C) for 55 minutes and then developed with perchloroethylene in a brush water in the course of 8 minutes.

The novel flexographic printing plate thus obtained was dried at 65° C. for 1 hour, stored for fifteen hours, and then uniformly afterexposed to actinic light for 20 minutes without this last step having been preceded by the aftertreatment with a halogen-containing solution.

Table 1 indicates the material composition of the novel photopolymerizable relief-forming layers (A) of the recording materials I-1 to I-8 according to the invention (Examples 1 to 8) prepared by this general method.

Test methods

The samples taken from the multilayered recording materials I-1 to I-8 according to the invention (Table 1, Examples 1 to 8) were used to determine the ozone resistance, the Shore A hardness and the swelling resistance (Examples 1 to 8) and also the elongation at break, the breaking strength and the minimum deformation (Examples 1 to 3).

Specifically, the Short A hardness was determined in accordance with German Standard Specification DIN 53505 and the elongation at break (%) and the breaking strength (N/mm$^2$) in accordance with German Standard Specification DIN 53504 in a conventional manner on uniformly exposed test strips or samples having the particular dimensions required.

To determine the minimum deformation, a uniformly exposed sample not less than 6 mm in thickness was placed underneath a die 4 mm in diameter with 1 kg weight on top for one minute, and afterwards the resulting thickness of the sample at the point of impression was measured (measurement reported as: thickness in % of initial thickness = % with load). The weight was then removed, and two minutes later the thickness at the point of impression was determined again (measurement reported as: thickness in % of initial thickness = % without load). Of the measured values, the first value (% with load) is a measure of the elasticity and plasticity of the sample, while the second value (% without load) is a measure of the plasticity alone.

The swelling resistance was measured in terms of the equilibrium swelling (%) of 2 cm wide and 10 cm long uniformly exposed test strips after 24 hours' storage in flexographic printing ink solvents.

To test the stability to ozone, 2 cm wide test strips were each irradiated for 10 minutes from one side, treated with a mixture of tetrachloroethylene and n-butanol (volume ratio=4:1) for 6 minutes, dried at 80° C. for 1 hour, stored at room temperature for 15 hours and afterexposed for 10 minutes. The strips thus prepared could accordingly be considered models of flexographic printing plates.

The strips were placed under 10% extension in an ozone chamber at 24° C. and exposed to air having an ozone content of 50 pphm. The time until the first ozone cracks appeared in the strips was taken to be a measure of ozone resistance.

Furthermore, the novel flexographic printing plates I-1 to I-8 produced by the general method (Table 1, Examples 1 to 8) were clamped onto printing cylinders and used in this form on a conventional flexographic printing press for printing together with conventional flexographic printing inks containing ketones and/or ethyl acetate. The quality of the novel flexographic printing plates was measured in terms of the length of run of excellent copies.

The test results obtained are presented in Table 2. They testify that the recording materials I according to the invention have an excellent range of application properties and are in particular ozone-resistant and non-swelling.

COMPARISONS C1 AND C2

The preparation and further processing of known light-sensitive recording materials.

Two known light-sensitive recording materials were produced in accordance with the general method described in connection with Examples 1 to 8. Their composition is contrasted in Table 1 (Comparisons C1 and C2) with the composition of the recording materials I-1 to I-8 according to the invention (Examples 1 to 8).

The properties of the known light-sensitive recording materials (Comparisons C1 and C2) were determined by the test methods described in connection with Examples 1 to 8. The results of these comparison tests are likewise represented in Table 2.

The comparison between the properties of recording materials I-1 to I-8 (Table 2, Examples 1 to 8) and those of the known recording materials C1 and C2 demonstrates the superiority of the recording materials I according to the invention.

In Table 1 below, the abbreviations have the following meanings:
($a_1$) binder;
($a_{11}$) EPDM rubber ®Buna AP 241 BMH from Hüls GmbH (ethylene content: 50% by weight; double bond content: 8 double bonds per 1,000 carbon atoms);
($a_{12}$) EPDM rubber ®Buna AP 447 from Hüls GmbH (ethylene content: 70% by weight; double bond content: 8 double bonds per 1,000 carbon atoms);
($a_{13}$) EPDM rubber ®Buna AP 447 from Hüls GmbH (ethylene content: 50% by weight; double bond content: 14 double bonds per 1,000 carbon atoms);
($a_2$) photoinitiator: benzil dimethyl acetal;
($a_3$) monomer;
($a_{31}$) isobornyl acrylate;
($a_{32}$) dihydrodicyclopentadienyl acrylate;
($a_{33}$) hex-1-en-6-yl acrylate;
($a_{34}$) thiodiethylene glycol diacrylate;
($a_4$) assistants;
($a_{41}$) di-n-octyl adipate;
($a_{42}$) naphthenic plasticizer (aromatics content less than 10% by weight; sulfur content less than 2% by weight);
($a_{43}$) polybutadiene of molecular weight 100;
($a_{44}$) pentaerythritol tetrathioglyconate;
($a_{45}$) phthalocyanine dye Siccoflush D (C.I. 74260);
($a_{46}$) 2,6-di-tert.-butyl-p-cresol;
X-Y-X conventional styrene-isoprene-styrene three-block copolymer;
X-Y-Z conventional three-block copolymer composed of a styrene block X, an isoprene block Y and a styrene-butadiene copolymer block Z;
HDA2 hexanediol diacrylate;
HDMA2 hexanediol dimethacrylate;
WO white oil, a conventional paraffin oil;
CL-P chloroparaffin, ®Hordaflex LC50 from Hoechst AG;
SSBB Sudan Deep Black BB (C.I. 26150);
OZ conventional antiozone wax: ®Antilux 1550 from Rheinchemie.

TABLE 1

The material composition of the novel photopolymerizable relief-forming layers (A) in recording materials I according to the invention (Examples 1 to 8) in comparison with the composition of known photopolymerizable relief-forming layers in known recording materials (Comparisons C1 and C2)

| | ($a_1$) parts by weight | ($a_2$) parts by weight | ($a_3$) parts by weight | ($a_4$) parts by weight |
|---|---|---|---|---|
| Example | | | | |
| 1 | 80 of ($a_{11}$) | 1($a_2$) | 5($a_{31}$) + 5($a_{32}$) | 5($a_{41}$) + 0.01($a_{45}$) + 0.5($a_{46}$) |
| 2 | 80 of ($a_{12}$) | 1($a_2$) | 5($a_{31}$) + 5($a_{32}$) | 5($a_{41}$) + 0.01($a_{45}$) + 0.5($a_{46}$) |
| 3 | 80 of ($a_{13}$) | 1($a_2$) | 5($a_{31}$) + 5($a_{32}$) | 5($a_{41}$) + 0.01($a_{45}$) + 0.5($a_{46}$) |
| 4 | 80 of ($a_{11}$) | 1($a_2$) | 5($a_{31}$) + 5($a_{32}$) | 5($a_{42}$) + 0.01($a_{45}$) + 0.5($a_{46}$) |
| 5 | 80 of ($a_{11}$) | 1($a_2$) | 5($a_{31}$) + 5($a_{32}$) | 5($a_{42}$) + 0.01($a_{43}$) + 0.01($a_{45}$) + 0.5($a_{46}$) |
| 6 | 80 of ($a_{11}$) | 1($a_2$) | 5($a_{31}$) + 5($a_{32}$) | 5($a_{42}$) + 0.01($a_{44}$) + 0.01($a_{45}$) + 0.5($a_{46}$) |
| 7 | 80 of ($a_{11}$) | 1($a_2$) | 10($a_{33}$) | 5($a_{41}$) + 0.01($a_{45}$) + 0.5($a_{46}$) |
| 8 | 80 of ($a_{11}$) | 1($a_2$) | 10($a_{34}$) | 0.01($a_{45}$) + 0.5($a_{45}$) + 0.5($a_{46}$) |
| Comparison | | | | |
| V1 | 80X-Y-X | 1($a_2$) | 5HDA2 + 5HDMA2 | 5WO + 0.01 SSBB + 0.5($a_{46}$) |
| V2 | 80X-Y-Z | 1($a_2$) | 5HDA2 + 5HDMA2 | 5Cl-P + 0.01 SSBB + 0.5($a_{46}$) |

TABLE 2

| | | Swelling in flexographic printing ink solvent | | | | | Minimum deformation | | | Number of copies on printing with a flexographic printing ink based on F2[b] |
|---|---|---|---|---|---|---|---|---|---|---|
| | Ozone resistance (min) | F1[a] (%) | F2[b] (%) | shore A | Elongation at break (%) | Breaking strength (N/mm²) | under-load (%) | without load (%) | | |
| Recording material | | | | | | | | | | |
| Example No. | | | | | | | | | | |
| 1 | I-1 | >480 | 6.3 | 7.2 | 40 | 480 | 0.9 | 79.2 | 96.7 | positive | >10⁶ |
| 2 | I-2 | >480 | 3.8 | 4.1 | 70 | 360 | 1.4 | 95 | 99.4 | positive | >10⁶ |
| 3 | I-3 | >480 | 6.5 | 7.8 | 65 | 320 | 1.5 | 97.7 | 99.2 | positive | >10⁶ |
| 4 | I-4 | >480 | 7.4 | 8.1 | 43 | — | — | — | — | positive | >10⁶ |
| 5 | I-5 | >480 | 8.2 | 9.8 | 45 | — | — | — | — | positive | >10⁶ |
| 6 | I-6 | >480 | 7.9 | 9.3 | 49 | — | — | — | — | positive | >10⁶ |
| 7 | I-7 | >480 | 4.3 | 6.8 | 42 | — | — | — | — | positive | >10⁶ |
| 8 | I-8 | >480 | 6.8 | 7.4 | 38 | — | — | — | — | positive | >10⁶ |
| Comparisons | | | | | | | | | | |
| C1 | <10 | >250 | >250 | 60 | 170 | 1.8 | 91.6 | 99.2 | positive | >10⁵ |
| C2 | >360 | >300 | >300 | 47 | 140 | 1.4 | 83.7 | 97.8 | positive | >10⁵ |

[a]Flexographic printing ink solvent composed of 50 parts by weight of ethanol and 50 parts by weight of ethyl acetate;
[b]Flexographic printing ink solvent composed of 50 parts by weight of ethanol, 35 parts by weight of ethyl acetate and 30 parts by weight of methyl ethyl ketone.

EXAMPLE 9

The production of recording materials I according to the invention and the further processing thereof into novel flexographic printing plates Example 1 of Table 1 was repeated, except that the polyamide layer (C) was replaced by a top layer (C) comprising an ethylene-propylene monomer copolymer (EPM) having an ethylene content of 55% by weight and that perchloroethylene as developer was replaced by petroleum spirits having a boiling point of from 185° to 210° C.

The resulting recording material I-9 had the same excellent properties as the recording materials I-1 to I-8 according to the invention (Tables 1 and 2, Examples 1 to 8) and gave a novel flexographic printing plate having a uniformly matt surface.

EXAMPLE 10

The preparation of recording materials I according to the invention and the further processing thereof into novel flexographic printing plates Example 1 was repeated, except that the thickness of the novel layer (A) was reduced from 2,900 μm to 1,000 μm (= Example I-1a).

In contradistinction to the general method described in the content of Examples 1 to 8, the temporary base (B) of recording material I-1a of structure (B)/(A)/(C)/(D) according to the invention was peeled off the novel layer (A) without prior uniform exposure.

The resulting recording material I-1a of structure (A)/(C)/(D) according to the invention was then laminated with the uncovered side of its novel layer (A) onto the uncovered side of a 2,300 μm thick photopolymerizable relief-forming layer of the known composition C1 (Table 1, Comparison C1) firmly bonded to a 125 μm thick polyethylene terephthalate sheet (B).

The recording material I-10 of structure (B)/known layer C1/new layer (A)/(C)/(D) according to the invention prepared in this way was then further processed in accordance with the general method described in the context of Examples 1 to 8, without however removing the base (B), under exposure and development conditions chosen in such a way as to give a relief layer (A') whose maximum depths extended down to the surface of the base (B). The novel flexographic printing plate with relief layer (A') obtained in this manner had a uniformly matt surface and excellent printing properties.

EXAMPLE 11

The production of recording materials I according to the invention and the further processing thereof into novel flexographic printing plates Example 10 was repeated, except that the known layer of composition C1 (Table 1, Comparison C1) was replaced by the known layer of composition C2 (Table 1, Comparison C2) and the recording material I—11 of the structure (B)/known layer C2/novel layer (A)/(C)/(D) according to the invention was uniformly exposed from the back through the base (B) to actinic light prior to its imagewise exposure and development. Thereafter, the recording material I—11 according to the invention was further processed as described in Example 10. The result was a novel flexographic printing plate whose relief layer (A') merely had depths of not more than 700 μm, owing to the preexposure from the back. This novel flexographic printing plate likewise had a uniformly matt surface and excellent printing properties.

EXAMPLES 12 TO 14

The production of recording materials I according to the invention and the further processing thereof into novel flexographic printing plates.

General experimental method

Components (a₁), (a₂), (a₃) and (a₄) of the novel photopolymerizable relief-forming layer (A) were dissolved in the desired weight ratio in toluene in such a total amount as to give a 25% strength coating solution. This coating solution was cast onto the side of a 125 μm thick polyethylene terephthalate sheet (B) provided with a polyurethane mixture of adhesive-forming components in such a way that once the wet layer had dried a 1,000 μm thick novel layer (A) was present.

The uncovered side of this novel layer (A) was laminated with a 75 μm thick matted polyethylene terephthalate sheet (D) provided with a 5 μm thick polyamide layer (C) in such a way as to give a recording material I of the structure (B)/(A)/(C)/(D) according to the invention.

This recording material I according to the invention was further processed into the recording material I according to the invention of the structure (B)/known layer (C2)/novel layer (A)/(C)/(D) according to the invention as described in Example 11. The latter was exposed and developed as described in Example 11. The result was a novel flexographic printing plate whose relief layer (A') merely had depths of not more than 700 μm, owing to the preexposure from the back.

This general method was used to produce the recording materials I—12, I—13 and I—14 according to the invention using in Example 12/recording material I—12 a mixture (A) of the composition of Example 1/Table 1, in Example 13/recording material I—13 a mixture (A) of the composition of Example 2/Table 1 and in Example 14/recording material I—14 a mixture (A) of the composition of Example 3/Table 1.

Use.

The novel flexographic printing plates produced from the recording materials I—12, I—13 and I—14 according to the invention by the general method all had a uniformly matt surface and faithfully reproduced the details of a test negative original. Their printing properties were excellent, each giving more than $10^6$ excellent copies.

We claim:

1. A light-sensitive recording element I useful for preparing photopolymer flexographic relief printing plates, the said light-sensitive recording element I comprising at least one photopolymerizable recording layer (A) having a thickness of from about 0.7 to about 6.5 mm and consisting essentially of
   ($a_1$) from 20 to 99.499% by weight of at least one polymeric binder from the group consisting of random ethylene-propylene-alkadiene terpolymers having an ethylene content of from 50 to 80% by weight and a double bond content of from 2 to 20 olefinic double bonds per 1,000 carbon atoms,
   ($a_2$) from 0.001 to 10% by weight of at least one photopolymeriztion initiator,
   ($a_3$) from 0.5 to 50% by weight of at least one monomer which is compatible with said binder ($a_1$) and has at least one photopolymerizable olefinic double bond, and
   ($a_4$) from 0.001 to 2% by weight of at least one inhibitor of thermally initiated polymerization and from 0.0001 to 5% by weight of at least one antioxidant as assistants, and a light-transmitting, smooth or matted, nontacky top layer (c) which soluble or swellable in the developers for the said photopolymerizable recording layer (A) and comprises a polymer which is tear resistant.

2. The light-sensitive recording element I of claim 1, wherein the photopolymerizable recording layer (A) further comprises from 0.005 to 5% by weight of at least one reducing agent as additional assistant ($a_4$).

3. The light-sensitive recording element I of claim 1, wherein 2,6-di-tert.-butyl-p-cresol is the inhibitor of thermally initiated polymerization and/or the antioxidant.

4. The light-sensitive recording element I of claim 2, wherein 2,6-di-tert.-butyl-p-cresol is the inhibitor of thermally initiated polymerization and/or the antioxidant.

5. The light-sensitive recording element I of claim 1, wherein the photopolymerizable recording layer (A) further comprises additional assistants ($a_4$) which assist in varying the range of properties, the sum of all the assistants ($a_4$) not exceeding 40% by weight.

6. The light-sensitive recording element I of claim 2, wherein the photopolymerizable recording layer (A) further comprises additional assistants ($a_4$) which assist in varying the range of properties, the sum of all the assistants ($a_4$) not exceeding 40% by weight.

7. The light-sensitive recording element I of claim 1, wherein the random ethylene-propylene-alkadiene terpolymer ($a_1$) has an ethylene content of from 45 to 75% by weight.

8. The light-sensitive recording element I of claim 1, wherein the random ethylene-propylene-alkadiene terpolymer ($a_1$) has a double bond content of from 4 to 15 olefinic double bonds per 1,000 carbon atoms.

9. The light-sensitive recording element I of claim 8, wherein the random ethylene-propylene-alkadiene terpolymer ($a_1$) has an ethylene content of from 45 to 75% by weight.

10. The light-sensitive recording element I of claim 1, wherein the alkadiene is selected from the group consisting of dicyclopentadiene, ethylidenenorbornene and trans-1,4-hexadiene.

11. The light-sensitive recording element I of claim 7, wherein the alkadiene is selected from the group consisting of dicyclopentadiene, ethylidenenorbornene and trans-1,4-hexadiene.

12. The light-sensitive recording element I of claim 8, wherein the alkadiene is selected from the group consisting of dicyclopentadiene, ethylidenenorbornene and trans-1,4-hexadiene.

13. The light-sensitive recording element I of claim 9, wherein the alkadiene is selected from the group consisting of dicyclopentadiene, ethylidenenorbornene and trans-1,4-hexadiene.

14. The light-sensitive recording element I of claim 10, wherein the alkadiene is selected from the group consisting of dicyclopentadiene, ethylidenenorbornene and trans-1,4-hexadiene.

15. The light-sensitive recording element I of claim 1, wherein the monomer ($a_3$) is selected from the group consisting of isobornyl acrylate, isobornyl methacrylate, dihydrodicyclopentadienyl acrylate, dihydrodicyclopentadienyl methacrylate, hex-1-en-6-yl acrylate, hex-1-en-6-yl methacrylate, dihydroxylimonene diacrylate dihydroxylimonene dimethacrylate, dicyclopentyldimethylene diacrylate, dicyclopentyldimethylene dimethacrylate, thiodiethylene glycol diacrylate, thiodiethylene glycol diacrylate, dodecanediol dimethyacrylate, di-n-butyl fumarate, di-n-octyl fumarate, diallyl phthalate, divinylbenzene and bisallyl itaconate.

16. The light-sensitive recording element I of claim 1 comprising a dimensionally stable base (B).

17. The light-sensitive recording element 1 of claim 1 wherein the smooth or matted nontacky top layer(c) comprises a polymer selected from the group consisting of homo- or copolyamides, polyurethanes poly(meth)acrylates, polyvinyl alcohol alkanecarboxylates of a degree of hydrolysis of from 30 to 99%, cyclorubbers of high cyclization, ethylene/propylene copolymers, homopolymers or copolymers of vinyl chloride, and ethylene/vinyl acetate copolymers.

18. The light-sensitive recording element I of claim 1 comprising a smooth or matted cover sheet (D).

19. The light-sensitive recording element I of claim 2, wherein the random ethylene-propylene-alkadiene terpolymer ($a_1$) has an ethylene content of from 45 to 75% by weight.

20. The light-sensitive recording element I of claim 2, wherein the random ethylene-propylene-alkadiene terpolymer ($a_1$) has a double bond content of from 4 to 15 olefinic double bonds per 1,000 carbon atoms.

21. The light-sensitive recording element I of claim 20, wherein the random ethylene-propylene-alkadiene terpolymer ($a_1$) has an ethylene content of from 45 to 75% by weight.

22. The light-sensitive recording element I of claim 2, wherein the alkadiene is selected from the group consisting of dicyclopentadiene, ethylidenenorbornene and trans-1,4-hexadiene.

23. The light-sensitive recording element I of claim 19, wherein the alkadiene is selected from the group consisting of dicyclopentadiene, ethylidenenorbornene and trans-1,4-hexadiene.

24. The light-sensitive recording element I of claim 20, wherein the alkadiene is selected from the group consisting of dicyclopentadiene, ethylidenenorbornene and trans-1,4-hexadiene.

25. The light-sensitive recording element I of claim 21, wherein the alkadiene is selected from the group consisting of dicyclopentadiene, ethylidenenorbornene and trans-1,4-hexadiene.

26. The light-sensitive recording element I of claim 22, wherein the alkadiene is selected from the group consisting of dicyclopentadiene, ethylidenenorbornene and trans-1,4-hexadiene.

27. The light-sensitive recording element I of claim 2, wherein the monomer ($a_3$) is selected from the group consisting of isobornyl acrylate, isobornyl methacrylate, dihydrodicyclopentadienyl acrylate, dihydrodicyclopentadienyl methacrylate, hex-1-en-6-yl acrylate, hex-1-en-6-yl methacrylate, dihydroxylimonene diacrylate, dihydroxylimonene dimethacrylate, dicyclopentyldimethylene diacrylate, dicyclopentyldimethylene dimethacrylate, thiodiethylene glycol diacrylate, thiodiethylene glycol dimethacrylate, benzyl acrylate, benzyl methacrylate, dodecanediol diacrylate, dodecanediol dimethacrylate, di-n-butyl fumarate, di-n-octyl fumarate, diallyl phthalate, divinylbenzene and bisallyl itaconate.

28. The light-sensitive recording element I of claim 2 comprising a dimensionally stable base (B).

29. The light-sensitive recording element I of claim 2 comprising a smooth or matted cover sheet (D).

* * * * *

UNITED STATES PATENT AND TRADEMARK OFFICE
CERTIFICATE OF CORRECTION

PATENT NO. : 4,994,344

DATED : Feb 19, 1991

INVENTOR(S) : Karl-Rudolf KURTZ et al.

It is certified that error appears in the above-identified patent and that said Letters Patent is hereby corrected as shown below:

On the title page and Col. 1, line 1,

The title "Sheetlike Light-Sensitive Recording" should read
        -- Sheetlike Light-Sensitive Recording Material --

Signed and Sealed this

Twenty-second Day of September, 1992

*Attest:*

DOUGLAS B. COMER

*Attesting Officer*      *Acting Commissioner of Patents and Trademarks*